(12) United States Patent
Ni et al.

(10) Patent No.: US 12,029,063 B2
(45) Date of Patent: Jul. 2, 2024

(54) DISPLAY PANEL, METHOD FOR MANUFACTURING SAME, AND DISPLAYING DEVICE

(71) Applicant: BOE Technology Group Co., Ltd., Beijing (CN)

(72) Inventors: Jingkai Ni, Beijing (CN); Zhongyuan Sun, Beijing (CN); Jinxiang Xue, Beijing (CN); Wenqi Liu, Beijing (CN); Che An, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 430 days.

(21) Appl. No.: 17/504,763

(22) Filed: Oct. 19, 2021

(65) Prior Publication Data

US 2022/0302413 A1    Sep. 22, 2022

(30) Foreign Application Priority Data

Mar. 18, 2021    (CN) .......................... 202110292685.1

(51) Int. Cl.
*H10K 59/131* (2023.01)
*H10K 50/844* (2023.01)
*H10K 71/00* (2023.01)
*H10K 71/13* (2023.01)

(52) U.S. Cl.
CPC ......... *H10K 50/844* (2023.02); *H10K 59/131* (2023.02); *H10K 71/00* (2023.02); *H10K 71/135* (2023.02)

(58) Field of Classification Search
CPC .................................................. H10K 50/844
See application file for complete search history.

(56) References Cited

U.S. PATENT DOCUMENTS

| 2019/0169470 A1* | 6/2019 | Dollase | C09J 7/385 |
| 2022/0209211 A1* | 6/2022 | Zhang | H10K 59/122 |

FOREIGN PATENT DOCUMENTS

| CN | 112310327 A | * | 2/2021 | ......... H01L 27/3244 |
| CN | 112310327 A | | 2/2021 | |

OTHER PUBLICATIONS

First Office Action in the Chinese Patent Application No. 202110292685.1 dated May 27, 2022; English translation attached.

* cited by examiner

*Primary Examiner* — Zandra V Smith
*Assistant Examiner* — Evan G Clinton
(74) *Attorney, Agent, or Firm* — Intellectual Valley Law, P.C.

(57) ABSTRACT

The disclosure provides a display panel, a method for manufacturing same, and a displaying device. The display panel is provided with a plurality of display units arranged at intervals and tensile units connecting every two adjacent display units, and the display panel further comprises a substrate; light-emitting elements arranged on one side of the substrate and positioned in the display units; and package structures at least arranged on the surfaces, away from the substrate, of the light-emitting elements and comprising at least one inorganic insulating layer, wherein orthographic projections of at least part of the tensile units on the substrate do not overlap with orthographic projections of the inorganic insulating layers on the substrate.

12 Claims, 8 Drawing Sheets

DISPLAY PANEL, METHOD FOR MANUFACTURING SAME, AND DISPLAYING DEVICE

The application claims priority to Chinese Patent Application No. 202110292685.1, titled "DISPLAY PANEL, METHOD FOR MANUFACTURING SAME, AND DISPLAYING DEVICE" and filed to the State Patent Intellectual Property Office on Mar. 18, 2021, the contents of which are incorporated herein by reference in its entirety.

TECHNICAL FIELD

The disclosure relates to the technical field of display, in particular to a display panel, a method for manufacturing same, and a displaying device.

BACKGROUND

Flexible displaying devices have bendable and foldable forms. With the personalized display requirements such as skin display, irregular display and arbitrary shape display, a tensile displaying device is likely to become the mainstream of the next generation display technology.

SUMMARY

The disclosure provides a display panel, a method for manufacturing same, and a displaying device.

In one aspect of the disclosure, a display panel is provided. According to an embodiment of the disclosure, the display panel is provided with a plurality of display units arranged at intervals and tensile units connecting every two adjacent display units, and the display panel further comprises a substrate; light-emitting elements arranged on one side of the substrate and positioned in the display units; and a package structure at least arranged on surfaces, away from the substrate, of the light-emitting elements and comprising at least one inorganic insulating layer, wherein orthographic projections of at least part of the tensile units on the substrate do not overlap with an orthographic projection of the inorganic insulating layers on the substrate.

According to an embodiment of the disclosure, no overlapping area exists between the orthographic projections of the tensile units on the substrate and the orthographic projection of the inorganic insulating layer on the substrate.

According to an embodiment of the disclosure, the tensile unit comprises: an organic film layer, the organic film layer is arranged on a surface of the substrate and located on a same side of the substrate as the light-emitting elements; and a tensile wiring layer, the tensile wiring layer is arranged on a surface of the organic film layer away from the substrate, and electrically connected with the light-emitting elements in the two corresponding adjacent display units.

According to an embodiment of the disclosure, the tensile unit further comprises: a passivation layer, the passivation layer is arranged on a surface of the tensile wiring layer away from the organic film layer.

According to an embodiment of the disclosure, the passivation layer is made from at least one of vinyl triethoxysilane, vinyl triacetoxysilane and chloromethyl triethoxysilane.

According to an embodiment of the disclosure, the display panel further comprises: a retaining wall, the retaining wall is arranged around a peripheral edge of at least one said display unit and in contact with the package structure, wherein an orthographic projection of the display unit on the substrate covers an orthographic projection of the retaining wall on the substrate.

According to an embodiment of the disclosure, the package structure comprises two inorganic insulating layers and an organic insulating layer positioned between the two inorganic insulating layers.

In another aspect of the disclosure, a method for manufacturing the display panel is provided. According to an embodiment of the disclosure, the method comprises: forming light-emitting elements on one side of a substrate; and forming package structures on surfaces, away from the substrate, of the light-emitting elements so as to obtain the display panel.

According to an embodiment of the disclosure, the step of forming the package structures on surfaces of the light-emitting elements away from the substrate comprises: forming a prefabricated film layer on surfaces of the display units and surfaces of the tensile units of the display panel; and patterning the prefabricated film layer by a patterning process, to form the inorganic insulating layer.

According to an embodiment of the disclosure, before forming the package structure on surfaces of the light-emitting elements away from the substrate, the method further comprises: forming an organic film layer on a surface of the substrate on a same side as the light-emitting elements; forming a tensile wiring layer on a surface of the organic film layer away from the substrate; and forming a passivation layer on a surface of the tensile wiring layer away from the organic film layer.

According to an embodiment of the disclosure, a process for forming the passivation layer comprises at least one of a coating process, a spraying process or an ink-jet printing process.

According to an embodiment of the disclosure, wherein before forming the package structure on surfaces of the light-emitting elements away from the substrate, the method further comprises: forming a retaining wall around a peripheral edge of at least one of the display units, wherein the package structure is in contact with the retaining wall.

In yet another aspect of the disclosure, a displaying device is provided. According to an embodiment of the disclosure, the displaying device comprises the display panel.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present application are provided below.

BRIEF DESCRIPTION OF THE DRAWINGS

In order to more clearly illustrate the technical solutions of the embodiments of the present disclosure or the related art, the figures that are required to describe the embodiments or the related art will be briefly introduced below. Apparently, the figures that are described below are merely embodiments of the present disclosure, and a person skilled in the art can obtain other figures according to these figures without paying creative work.

DETAILED DESCRIPTION

Embodiments of the disclosure are described in detail below. The embodiments described below are exemplary ones merely used to explain the disclosure, and should not be construed as limiting the disclosure. If specific technologies or conditions are not indicated in the embodiments, they shall be performed according to the technologies or conditions described in the literature in this field or according to the product specifications.

This disclosure is based on the following findings of the inventors:

After in-depth investigation of the structures of displaying devices in related arts and a large number of experimental verifications, the inventors found that when the displaying device is tensile, its packaging effect will deteriorate because the displaying device has display units and tensile units, and when the displaying device realizes tensile deformation, the main deformation area of the whole displaying device is in the tensile units. However, package structures are generally formed on the whole displaying device, and inorganic insulation layers in the package structures are brittle because they are made of inorganic materials, so the inorganic insulation layers in the package structures in the tensile units are prone to fracture after tensile deformation of the displaying device. When the inorganic insulation layers break, cracks will continue to extend into the display units along with the stretching of the inorganic insulation layers, and these cracks will become intrusion channels of water vapor and oxygen, thus causing black spots and other defects during display, making the display effect poor.

On this basis, in one aspect of the disclosure, a display panel is provided. According to an embodiment of the disclosure, referring to FIGS. 1 and 2, the display panel has a plurality of display units 1 arranged at intervals and tensile units 2 connecting every two adjacent display units 1. The display panel comprises a substrate 100; light-emitting elements 200 disposed on one side of the substrate 100 and located in the display units 1; and package structures at least arranged on surfaces, away from the substrate 100, of the light-emitting elements 200 and comprising at least one inorganic insulating layer 300, wherein orthographic projections of at least part of the tensile units 2 on the substrate 100 do not overlap with orthographic projections of the inorganic insulating layers 300 on the substrate 100. The display panel has the tensile units 2 capable of realizing tensile deformation. In addition, in the display panel, at least part of the tensile units 2 do not have the inorganic insulating layers 300 in the package structures, so that the package structures rarely crack during tensile deformation of the display panel, and the extension of cracks of the inorganic insulating layers 300 towards the display units 1 caused by the stretching action is avoided, thus making the package structures have good packaging reliability and further ensuring the display effect of the display panel after tensile deformation.

Figure 1:
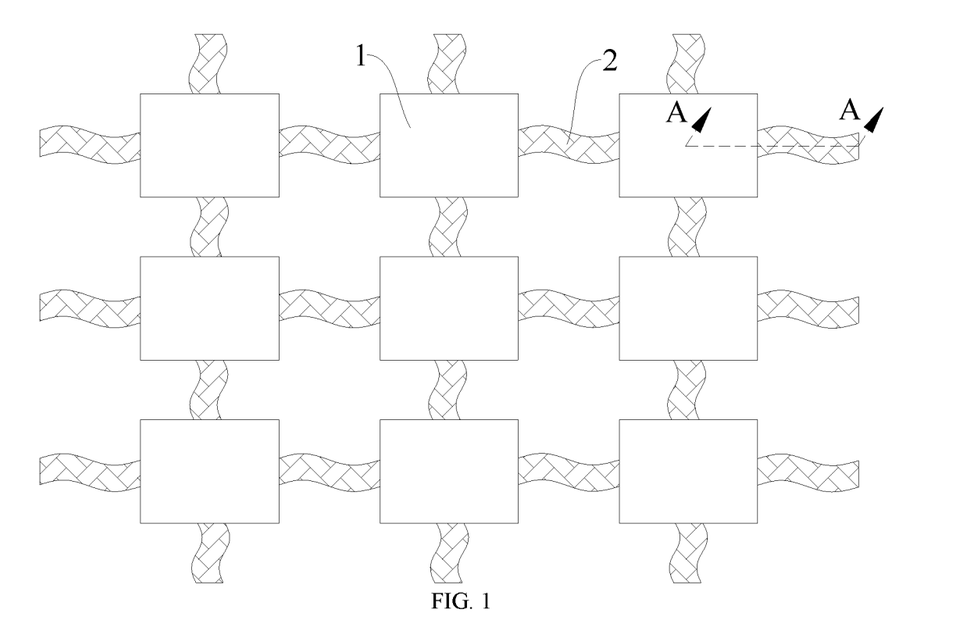
FIG. 1 shows a plan view of a display panel according to an embodiment of the disclosure.
Figure 2:
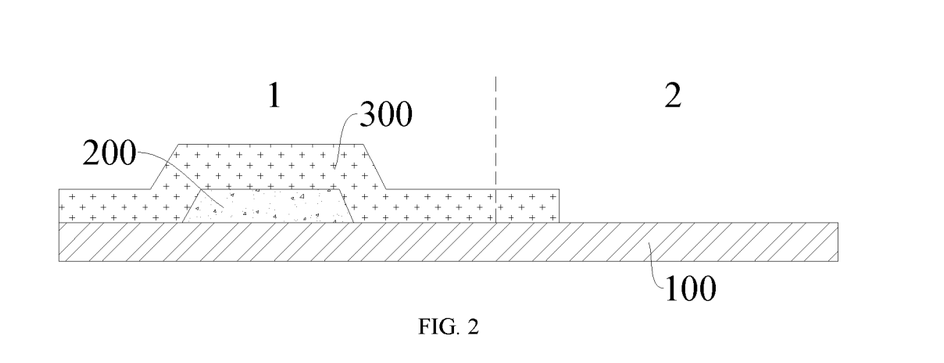
FIG. 2 shows a sectional view of the display panel along line AA in the embodiment of FIG. 1.

According to the embodiments of the disclosure, it should be noted that, with reference to FIG. 1, the numbers of the display units 1 and the tensile units 2 in the display panel of the disclosure are not particularly limited, and the figure only shows the situation that four tensile units 2 are arranged around one display unit 1. Those skilled in the art can understand that when the display panel is in other shapes, tensile units of other numbers may be arranged around one display unit, such as three, five, etc., which will not be specified here. In addition, in the display panel of the disclosure, those skilled in the art can understand that other parts except the display units 1 and the tensile units 2 may be hollowed out, so as to realize tensile deformation better.

According to the embodiments of the disclosure, the material and thickness of the substrate 100 are not particularly limited, and may be the material and thickness of substrates in related arts, which will not be specified here.

Figure 3:
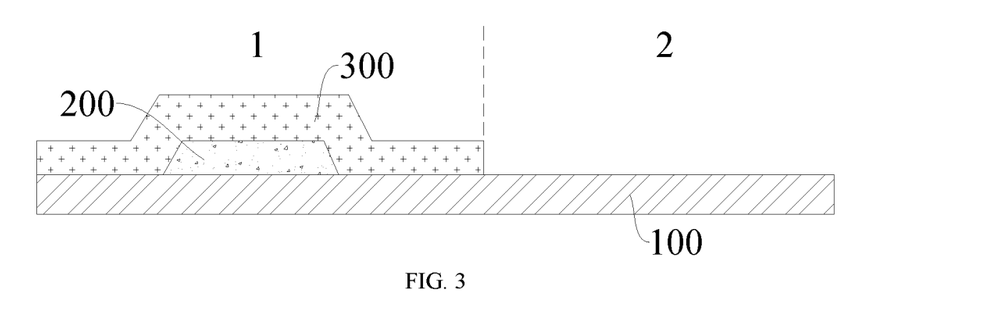
FIG. 3 shows another sectional view of the display panel along line AA in the embodiment of FIG. 1.

According to the embodiments of the disclosure, in order to better realize the effect that the package structures rarely crack during tensile deformation of the display panel, and the extension of cracks of the inorganic insulating layers 300 towards the display units 1 caused by the stretching action is avoided, further referring to FIG. 3, no overlapping area exists between the orthographic projections of the tensile units 2 on the substrate 100 and the orthographic projections of the inorganic insulating layers 300 on the substrate 100. In this display panel, no inorganic insulating layer 300 is disposed in the package structure in the whole tensile unit 2, so the package structures are less prone to cracking during tensile deformation, and the cracks of the inorganic insulating layers 300 caused by the stretching action are further prevented from extending towards the display units 1, thus further improving the packaging reliability of the package structures and further ensuring the display effect of the display panel after tensile deformation.

Figure 4:
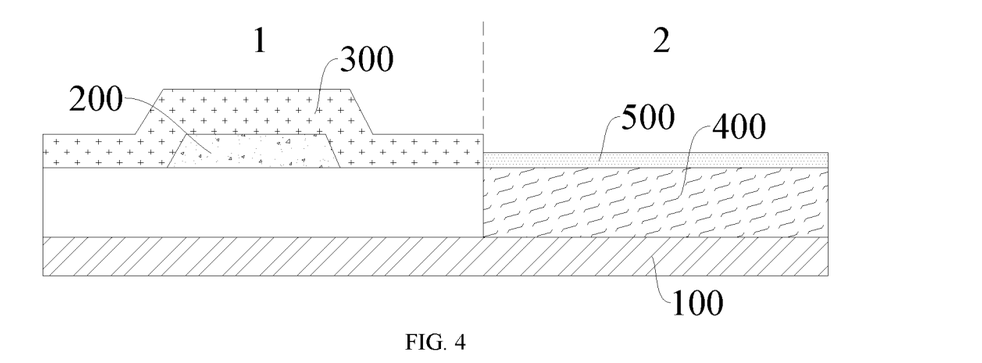
FIG. 4 shows another sectional view of the display panel along line AA in the embodiment of FIG. 1.

According to the embodiments of the disclosure, further referring to FIG. 4, the tensile unit 2 may further comprise an organic film layer 400 disposed on a surface of the substrate 100 and located on the same size of the substrate 100 as the light-emitting elements 200; and a tensile wiring layer 500 arranged on a surface, away from the substrate 100, of the organic film layer 400, and electrically connected with the light-emitting elements in two corresponding adjacent display units (not shown in the figure, but those skilled in the art can understand that the tensile wiring layer can be electrically connected with the light-emitting elements in two corresponding adjacent display units directly or via a through hole, which will not be specified here). Therefore, through the arrangement of the organic film layers, on the one hand, a flattening function is realized, so that a forming plane of the tensile wiring layers and a forming plane of the display units are as small as possible, thereby reducing the fracture of the tensile wiring layers caused by excessive difference of deposition sections; on the other hand, because the organic film layers are soft, the resistance of the display panel during stretching may be reduced, so that deformation is easier, and tensile deformation may be achieved more easily without cracking.

Figure 5:
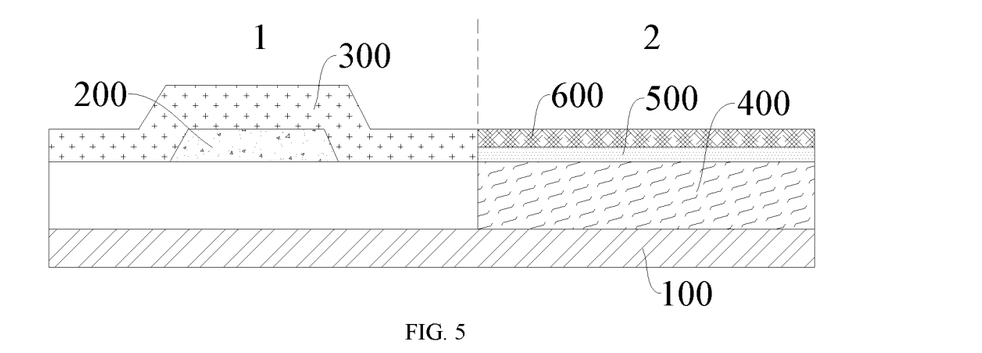
FIG. 5 shows another sectional view of the display panel along line AA in the embodiment of FIG. 1.

According to the embodiments of the disclosure, further, in order to better realize the effect that the orthographic projections of at least part of the tensile units 2 on the substrate 100 do not overlap with the orthographic projections of the inorganic insulating layers 300 on the substrate 100, specifically, referring to FIG. 5, a passivation layer 600 may be further disposed on the tensile unit 2 and is disposed on a surface, away from the organic film layer 400, of the tensile wiring layer 500. Therefore, by arranging the passivation layer 600, the surface, away from the organic film layer 400, of the tensile wiring layer 500 is passivated, and then it may be used as a mask when the package structure is formed, so that the orthographic projection of the tensile unit 2 on the substrate 100 does not overlap with the orthographic projection of the inorganic insulating layer 300 on the substrate 100 directly, and the process of manufacturing the package structure is simpler and easier to realize.

In some more specific embodiments of the disclosure, the passivation layer 600 may be made from vinyl triethoxysilane, vinyl triacetoxysilane or chloromethyl triethoxysilane, etc. Therefore, when the package structure is formed, a surface of the package structure to be deposited usually has hydroxyl groups, and these hydroxyl groups may be used as reactive sites for the subsequent formation of the package structure (such as alumina). After the passivation layer 600 described above is formed, for example, the vinyl triethoxysilane, vinyl triacetoxysilane or chloromethyl triethoxysilane will replace the hydroxyl groups on the surface of the package structure to be deposited with inert alkyl groups or silane groups, etc. At this point, when the package structure is deposited, the package structure may still be formed at a position, without the passivation layer, on the surface of the package structure to be deposited, but the package structure may not be formed at a position with the passivation layer, so that the orthographic projection of the tensile unit 2 on the substrate 100 does not overlap with the orthographic projection of the inorganic insulating layer 300 on the substrate 100, and the above materials are widely available and have low cost.

Figure 6:
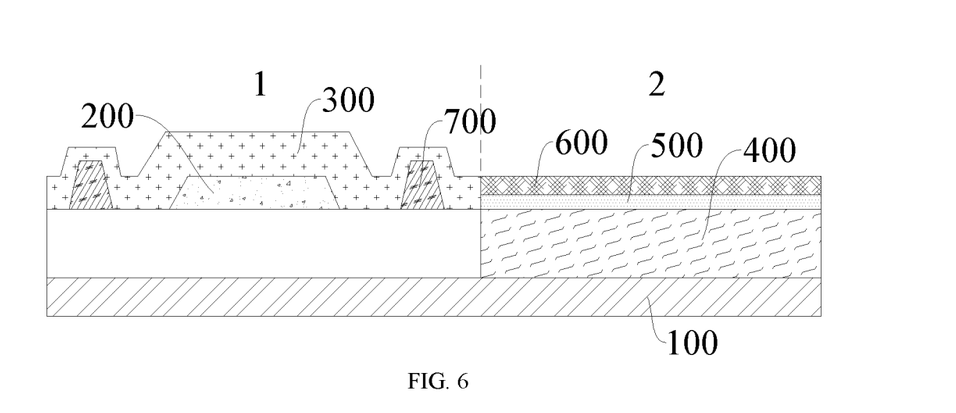
FIG. 6 shows another sectional view of the display panel along line AA in the embodiment of FIG. 1.

In other embodiments of the disclosure, referring to FIG. 6, the display panel may further comprise a retaining wall 700 arranged around a peripheral edge of at least one display unit 1, the retaining wall 700 is in contact with the package structures, and the orthographic projection of the display unit 1 on the substrate 100 covers an orthographic projection of the retaining wall 700 on the substrate 100. Therefore, the display panel may further prevent water and oxygen invasion, and the packaging reliability is further improved.

According to the embodiments of the disclosure, in addition, in the display panel described in the disclosure, those skilled in the art can understand that other conventional structures or components in conventional display panels may be included too, whose structures, materials and functions are the same as those of the same components in conventional display panels (for example, the material of the tensile wiring layer may be Ti/Al/Ti, Mo, Al/Nb and other metals; or it can be a functional conductive material, such as silver nanowires or conductive rubber, etc.). The specific structures, materials and functions of the aforementioned structures and components are also the same as those of the same components in the display panels of related arts, and thus will not be described in detail here.

Figure 7:
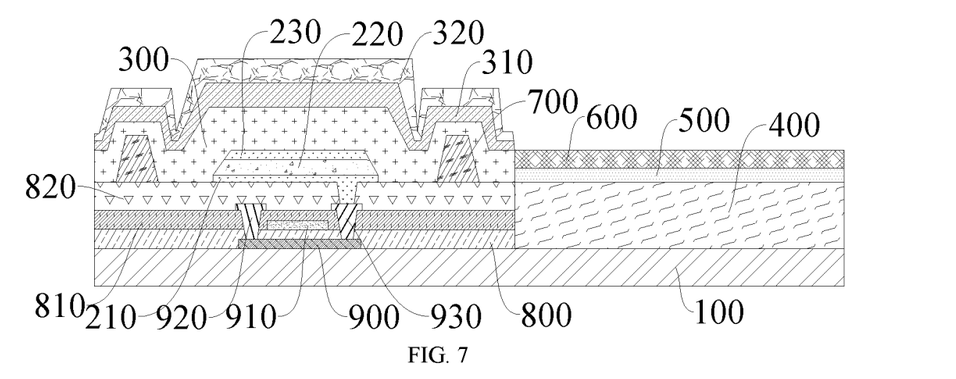
FIG. 7 shows another sectional view of the display panel along line AA in the embodiment of FIG. 1.

In a specific embodiment of the disclosure, referring to FIG. 7, the display panel may also comprise structures of conventional display panels in related arts, such as a light shielding layer (not shown in the figure), a thin film transistor comprising a grid 910, a source 920, a drain 930 and an active layer 900, a grid insulating layer 800, an interlayer insulating layer 810, a planarization layer 820, etc. The light-emitting element may comprise an anode 210, a luminescent layer 220, a cathode 230, etc. A pixel defining layer (not shown in the figure), an organic insulating layer 310 and a second inorganic insulating layer 320 in the package structure, etc. may also be included, and their specific structures, and the connection modes and functions of various components may be the same as those in related arts, and thus not be described in detail here.

Specifically, when the package structure described above has two inorganic insulating layers 300 and 320 and an organic insulating layer 310 between the two inorganic insulating layers 300 and 320, the packaging effect is further improved, and the packaging reliability may be more effectively ensured. More specifically, the inorganic insulating layers 300 and 320 may be made from SiNx, SiON, SiCN, SiOx, $A_{l2}O_3$, MgO, ZnO, etc. Of course, it can be understood that the package structure may only comprise the two inorganic insulating layers 300 and 320 described above, and not comprise the organic insulating layer, and the materials of the inorganic insulating layers 300 and 320 may be the same as those described above, which may shorten the manufacturing cycle and facilitate industrial production; meanwhile, the problem that accurate control of a coverage area is hard to achieve due to the preparation of the organic insulating layer can be avoided.

Figure 8:
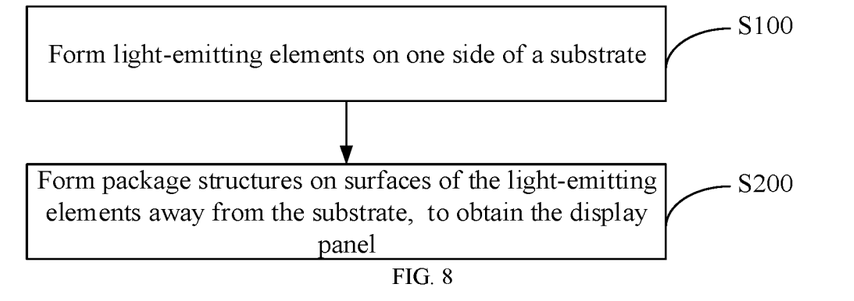
FIG. 8 shows a flowchart of a method for manufacturing a display panel according to an embodiment of the disclosure.
Figure 9A:
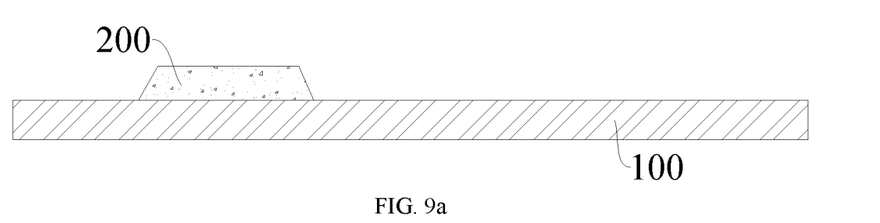
FIG. 9a and FIG. 9b show a flowchart of a method for manufacturing a display panel according to another embodiment of the disclosure.

In another aspect of the disclosure, a method for manufacturing the display panel is provided. According to the embodiments of the disclosure, referring to FIGS. 8, 9a and 9b, the method may specifically comprise the following steps:

S100, forming light-emitting elements 200 on one side of a substrate 100 (see FIG. 9a for structural diagram).

According to the embodiments of the disclosure, the process of forming the light-emitting elements 200 on one side of the substrate 100 may include vacuum evaporation, chemical vapor deposition, spin coating, ink-jet printing, and the like. The process parameters of vacuum evaporation, chemical vapor deposition, spin coating, and ink-jet printing are those of conventional vacuum evaporation, chemical vapor deposition, spin coating, and ink-jet printing, which will not be specified here. The manufacturing process is simple, convenient, easy to realize and capable of facilitating industrial production.

Figure 9B:
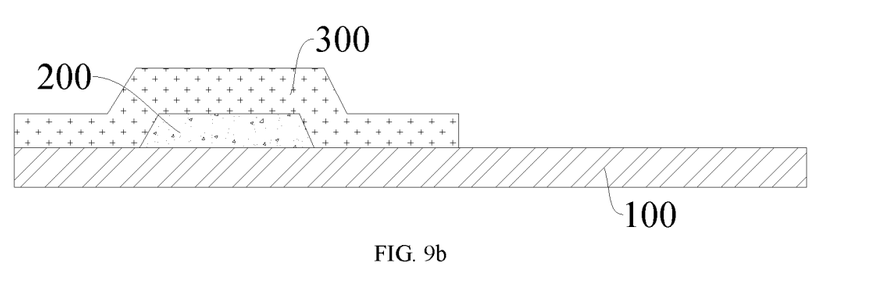

S200, forming package structures 300 on surfaces, away from the substrate 100, of the light-emitting elements 200 so as to obtain the display panel (see FIG. 9b for structural diagram).

According to the embodiments of the disclosure, the process of forming the package structures 300 on the surfaces, away from the substrate 100, of the light-emitting elements 200 may include vacuum evaporation, chemical vapor deposition, spin coating, ink-jet printing, and the like. The process parameters of vacuum evaporation, chemical vapor deposition, spin coating, and ink-jet printing are those of conventional vacuum evaporation, chemical vapor deposition, spin coating, and ink-jet printing, which will not be specified here. The manufacturing process is simple, convenient, easy to realize and capable of facilitating industrial production.

Figure 10:
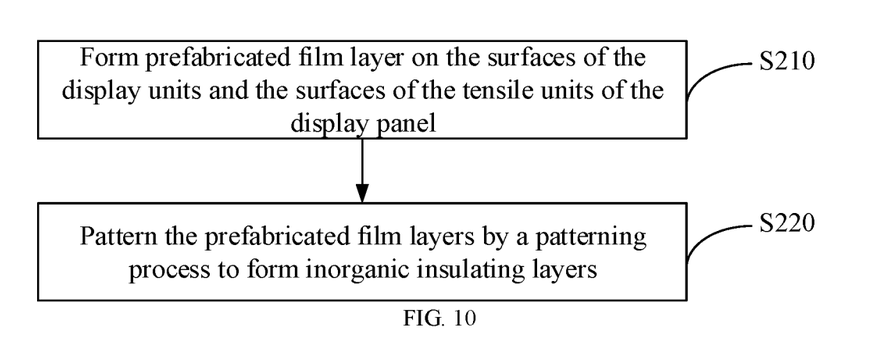
FIG. 10 shows a flowchart of forming a package structure according to an embodiment of the disclosure.
Figure 11:
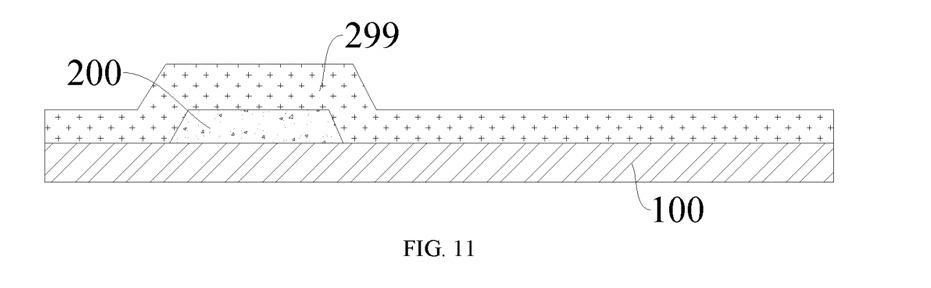
FIG. 11 shows a structural diagram of a prefabricated film layer during the formation of a package structure according to another embodiment of the disclosure.

Specifically, in some embodiments of the disclosure, referring to FIGS. 10 and 11, forming the package structures on surfaces, away from the substrate, of the light-emitting elements may further comprise:

S210, forming prefabricated film layers 299 on surfaces of the display units and surfaces of the tensile units of the display panel (see FIG. 11 for structural diagram).

According to the embodiments of the disclosure, the process of forming the prefabricated film layers 299 on the surfaces of the display units and the surfaces of the tensile units of the display panel may include vacuum evaporation, chemical vapor deposition, spin coating, ink-jet printing, and the like. The process parameters of vacuum evaporation, chemical vapor deposition, spin coating, and ink-jet printing are those of conventional vacuum evaporation, chemical vapor deposition, spin coating, and ink-jet printing, which will not be specified here. The manufacturing process is simple, convenient, easy to realize and capable of facilitating industrial production.

S220, patterning the prefabricated film layers by a patterning process to form inorganic insulating layers 300 (see FIG. 9b for structural diagram).

According to the embodiments of the disclosure, the patterning process may include: coating a surface of the prefabricated film layer with a photoresist, exposing, developing, etching, stripping the photoresist, etc., so as to form the inorganic insulating layer 300. The specific process parameters of each step in the patterning process are the process parameters of a conventional patterning process, which will not be specified here. The manufacturing process is simple, convenient, easy to realize and capable of facilitating industrial production.

Figure 12:
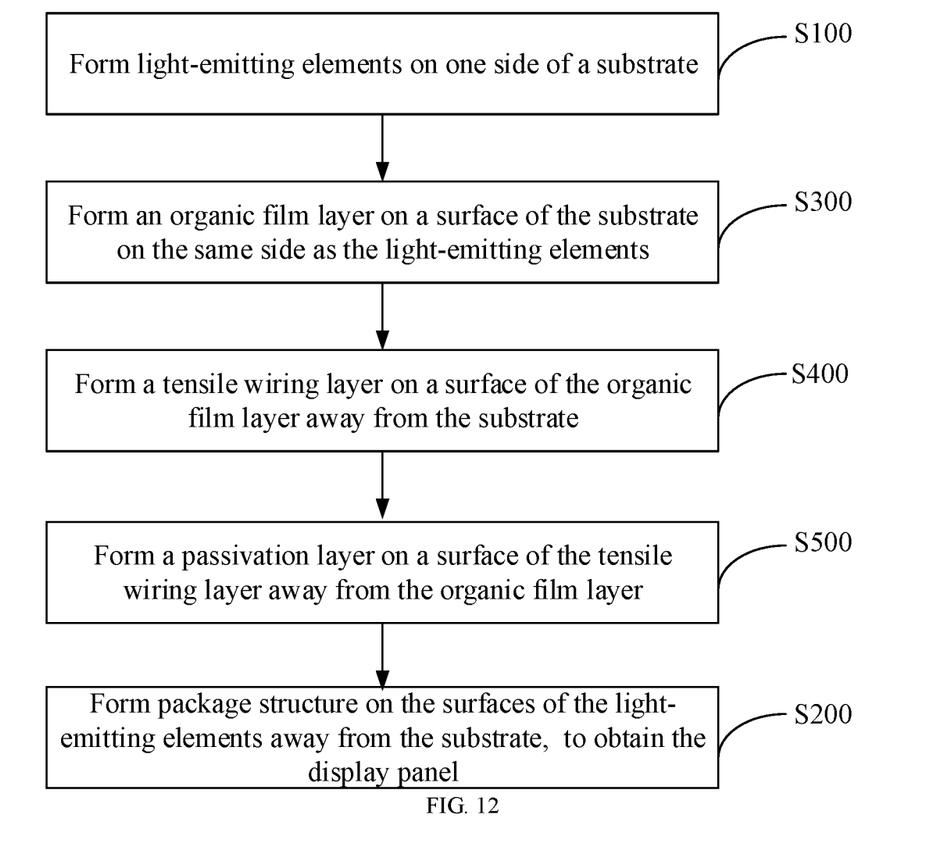
FIG. 12 shows a flowchart of a method for manufacturing a display panel according to another embodiment of the disclosure.

Specifically, in other embodiments of the disclosure, referring to FIG. 12, before forming the package structures on the surfaces, away from the substrate, of the light-emitting elements, the method may further comprise:

S300, forming an organic film layer on a surface of the substrate on the same side as the light-emitting elements.

According to the embodiments of the disclosure, the process of forming the organic film layer on the surface of the substrate on the same side as the light-emitting elements may include vacuum evaporation, chemical vapor deposition, spin coating, ink-jet printing, and the like. The process parameters of vacuum evaporation, chemical vapor deposition, spin coating, and ink-jet printing are those of conventional vacuum evaporation, chemical vapor deposition, spin coating, and ink-jet printing, which will not be specified here. The manufacturing process is simple, convenient, easy to realize and capable of facilitating industrial production.

S400, forming a tensile wiring layer on a surface, away from the substrate, of the organic film layer.

According to the embodiments of the disclosure, the process of forming the tensile wiring layer on the surface, away from the substrate, of the organic film layer may include vacuum sputtering deposition, screen printing, chemical vapor deposition, ink-jet printing, and the like. The process parameters of vacuum sputtering deposition, screen printing, chemical vapor deposition, and ink-jet printing are those of conventional vacuum sputtering deposition, screen printing, chemical vapor deposition, and ink-jet printing. The manufacturing process is simple, convenient, easy to realize and capable of facilitating industrial production.

S500, forming a passivation layer on a surface, away from the organic film layer, of the tensile wiring layer.

According to the embodiments of the disclosure, the process of forming the passivation layer on the surface, away from the organic film layer, of the tensile wiring layer may include coating, spraying, ink-jet printing, and the like. The process parameters of coating, spraying, and ink-jet printing are those of conventional coating, spraying, and ink-jet printing, wherein spraying or ink-jet printing may be performed through fixed-printing head printing, high-precision printing and other methods, which will not be specified here. The manufacturing process is simple, convenient, easy to realize and capable of facilitating industrial production, and the passivation layer may be better formed.

Figure 13:
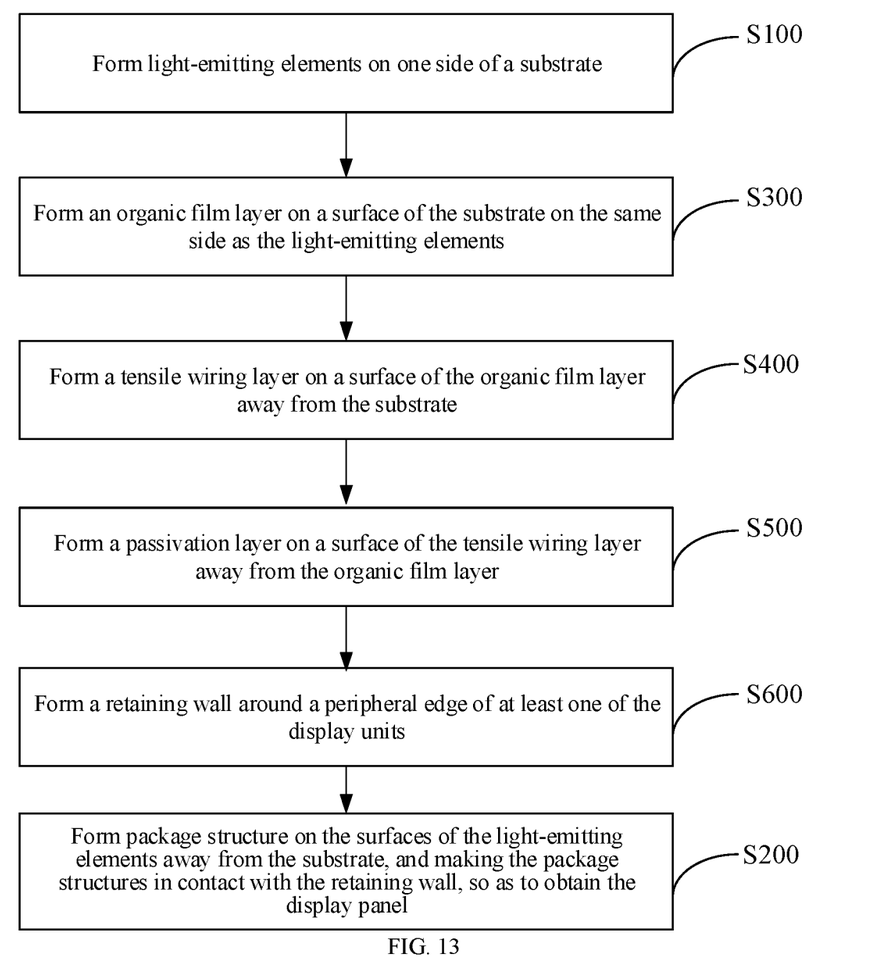
FIG. 13 shows a flowchart of a method for manufacturing a display panel according to another embodiment of the disclosure.

In some other embodiments of the disclosure, referring to FIG. 13, before forming the package structures on the surfaces, away from the substrate, of the light-emitting elements, the method may further comprise:

S600, forming a retaining wall around a peripheral edge of at least one of the display units, wherein the package structures are in contact with the retaining wall.

According to embodiments of the disclosure, the process of forming the retaining wall around the peripheral edge of at least one of the display units may include spin coating, slit coating, ink-jet printing, screen printing, chemical vapor deposition, exposure etching, and the like. The process parameters of spin coating, slit coating, ink-jet printing, screen printing, chemical vapor deposition, and exposure etching are those of conventional spin coating, slit coating, ink-jet printing, screen printing, chemical vapor deposition, and exposure etching, which will not be specified here. The manufacturing process is simple, convenient, easy to realize and capable of facilitating industrial production.

In yet another aspect of the disclosure, a displaying device is provided. According to the embodiments of the disclosure, the displaying device comprises the display panel. The displaying device can realize tensile deformation, and in the process of tensile deformation, the package structures rarely crack, so the packaging reliability is good. Meanwhile, the displaying device has all the features and advantages of the display panel, which will not be repeated here.

According to the embodiments of the disclosure, the displaying device comprises other necessary structures and components in addition to the aforementioned display panel, which can be supplemented and designed by those skilled in the art according to the specific types of the displaying device and use requirements, and will not be described in detail here.

According to the embodiments of the disclosure, the specific types of the displaying device are not particularly limited, for example, including but not limited to mobile phones, tablet personal computers, wearable devices, game machines, televisions, and vehicle-mounted displays.

In this specification, descriptions referring to the terms "one embodiment", "some embodiments", "example", "specific example", or "some examples" mean that specific features, structures, materials or characteristics described in connection with this embodiment or example are included in at least one embodiment or example of this disclosure. In this specification, the schematic expressions of these terms do not necessarily refer to the same embodiments or examples. Furthermore, the specific features, structures, materials or characteristics described may be combined in any one or more embodiments or examples in a suitable manner. In addition, those skilled in the art may combine different embodiments or examples and features of different embodiments or examples described in this specification without contradicting each other.

Although the embodiments of the disclosure have been shown and described above, it can be understood that the above-mentioned embodiments are exemplary and cannot be understood as limiting the disclosure, and those of ordinary skill in the art can make changes, modifications, substitutions and variations to the above-mentioned embodiments within the scope of the disclosure.

The invention claimed is:

1. A display panel, wherein, the display panel is provided with a plurality of display units arranged at intervals and tensile units connecting every two adjacent display units, and the display panel further comprises:
   a substrate;
   light-emitting elements arranged on one side of the substrate and positioned in the display units; and
   a package structure at least arranged on surfaces of the light-emitting elements away from the substrate, and comprises at least one inorganic insulating layer, wherein orthographic projections of at least part of the tensile units on the substrate do not overlap with an orthographic projection of the inorganic insulating layer on the substrate;
   wherein each of the tensile units comprises:
   an organic film layer arranged on a surface of the substrate and located on a same side of the substrate as the light-emitting elements; and
   a tensile wiring layer arranged on a surface of the organic film layer away from the substrate, and electrically connected with the light-emitting elements in two adjacent display units;
   wherein each of the tensile units further comprises:
   a passivation layer arranged on a surface of the tensile wiring layer away from the organic film layer;
   wherein the passivation layer is made from at least one of vinyl triethoxysilane, vinyl triacetoxysilane and chloromethyl triethoxysilane.

2. The display panel according to claim 1, wherein no overlapping area exists between the orthographic projections of the tensile units on the substrate and the orthographic projection of the inorganic insulating layer on the substrate.

3. The display panel according to claim 1, wherein the display panel further comprises:
   a retaining wall arranged around a peripheral edge of at least one said display unit and in contact with the package structure, wherein an orthographic projection of the display unit on the substrate covers an orthographic projection of the retaining wall on the substrate.

4. The display panel according to claim 1, wherein the package structure comprises two inorganic insulating layers and an organic insulating layer positioned between the two inorganic insulating layers.

5. A method for manufacturing the display panel according to claim 1, wherein the method comprises:
   forming light-emitting elements on one side of the substrate; and
   forming a package structure on surfaces of the light-emitting elements away from the substrate, to obtain the display panel;
   wherein before forming the package structure on surfaces of the light-emitting elements away from the substrate, the method further comprises:
   forming the organic film layer on the surface of the substrate on the same side the light-emitting elements;
   forming the tensile wiring layer on the surface of the organic film layer away from the substrate; and
   forming the passivation layer on the surface of the tensile wiring layer away from the organic film layer;
   wherein the passivation layer is made from at least one of vinyl triethoxysilane, vinyl triacetoxysilane and chloromethyl triethoxysilane.

6. The method according to claim 5, wherein the step of forming the package structures on surfaces of the light-emitting elements away from the substrate comprises:
   forming a prefabricated film layer on surfaces of the display units and surfaces of the tensile units of the display panel; and
   patterning the prefabricated film layer by a patterning process, to form the inorganic insulating layer.

7. The method according to claim 5, wherein a process for forming the passivation layer comprises at least one of a coating process, a spraying process or an ink-jet printing process.

8. The method according to claim 5, wherein before forming the package structure on surfaces of the light-emitting elements away from the substrate, the method further comprises:
   forming a retaining wall around a peripheral edge of at least one of the display units, wherein the package structure is in contact with the retaining wall.

9. A displaying device, wherein the displaying device comprises the display panel according to claim 1;
   wherein each of the tensile units comprises:
   the organic film layer arranged on the surface of the substrate and located on the same side of the substrate as the light-emitting elements; and
   the tensile wiring layer arranged on the surface of the organic film layer away from the substrate, and electrically connected with the light-emitting elements in the two corresponding adjacent display units;
   wherein each of the tensile units further comprises:
   the passivation layer arranged on the surface of the tensile wiring layer away from the organic film layer;
   wherein the passivation layer is made from at least one of vinyl triethoxysilane, vinyl triacetoxysilane and chloromethyl triethoxysilane.

10. The displaying device according to claim 9, wherein no overlapping area exists between the orthographic projections of the tensile units on the substrate and the orthographic projection of the inorganic insulating layer on the substrate.

11. The displaying device according to claim 9, wherein the display panel further comprises:
    a retaining wall arranged around a peripheral edge of at least one said display unit and in contact with the package structure, wherein an orthographic projection of the display unit on the substrate covers an orthographic projection of the retaining wall on the substrate.

12. The displaying device according to claim 9, wherein the package structure comprises two inorganic insulating layers and an organic insulating layer positioned between the two inorganic insulating layers.

* * * * *